United States Patent [19]

Kawanishi et al.

[11] Patent Number: 5,208,468
[45] Date of Patent: May 4, 1993

[54] SEMICONDUCTOR LASER DEVICE WITH A SULFUR-CONTAINING FILM PROVIDED BETWEEN THE FACET AND THE PROTECTIVE FILM

[75] Inventors: Hidenori Kawanishi; Taiji Morimoto; Shinji Kaneiwa, all of Nara; Hiroshi Hayashi, Soraku; Nobuyuki Miyauchi, Yamatokoriyama; Seiki Yano, Kashihara; Mitsuhiro Matsumoto, Nara; Kazuaki Sasaki, Yao; Masaki Kondo; Takehiro Shiomoto, both of Nara; Saburo Yamamoto, Uda, all of Japan

[73] Assignee: Sharp Kabushiki Kaisha, Osaka, Japan

[21] Appl. No.: 727,375

[22] Filed: Jul. 5, 1991

Related U.S. Application Data

[63] Continuation of Ser. No. 474,272, Feb. 2, 1990, abandoned.

[30] Foreign Application Priority Data

Feb. 3, 1989 [JP] Japan .................................. 1-26414
Nov. 6, 1989 [JP] Japan .................................. 1-289705
Dec. 29, 1989 [JP] Japan .................................. 1-341890

[51] Int. Cl.$^5$ ................................................ H01L 33/00
[52] U.S. Cl. .......................................... 257/98; 372/49
[58] Field of Search ................... 372/49, 43; 357/17; 437/129

[56] References Cited

U.S. PATENT DOCUMENTS

| | | | |
|---|---|---|---|
| 3,849,738 | 11/1974 | Hakki | 372/49 |
| 4,001,719 | 1/1977 | Krupka | 372/49 |
| 4,317,086 | 2/1982 | Scifres et al. | 357/17 |
| 4,656,638 | 4/1987 | Tihanyi et al. | 372/49 |
| 4,840,922 | 6/1989 | Kobayashi et al. | 372/49 |
| 4,855,256 | 8/1989 | Kobayashi et al. | 372/49 |
| 4,870,649 | 9/1989 | Bobeck et al. | 372/49 |

FOREIGN PATENT DOCUMENTS

| | | | |
|---|---|---|---|
| 0096509 | 12/1983 | European Pat. Off. | 357/17 |
| 0197719 | 10/1986 | European Pat. Off. | 357/17 |
| 61-215661 | 9/1986 | Japan | 357/17 |

OTHER PUBLICATIONS

Appl. Phys. Lett. 51(1), 6 Jul. 1987, pp. 33-35, "Dramatic Enhancement in the Gain of a GaAs/AlGaAs Heterostructure Bipolar Transistor by Surface Chemical Passivation", by C. J. Sandroff et al.

Extended Abstracts of the 20th (1988 International) Conference on Solid State Devices and Materials, Tokyo, 1988, pp. 262-266, "Stabilization of GaAs Surface/Interface by Sulfur Treatment", by H. Oigawa et al.

Patent Abstract of Japan, vol. 12, No. 256, (E-635).
Patent Abstracts of Japan, vol. 8, No. 127, (E-250).
Patent Abstracts of Japan, vol. 12, No. 94, (E-593).
Oigawa et al., Extended Abstracts of the 20th (1988 International) Conference on Solid State Devices and Materials (1988) pp. 263-266.
Yablonovitch et al., Appl. Phys. Lett. (1987) 51(6):439-441.
Kawanishi et al., *Extended Abstracts of the 21st Conference on Solid State Devices and Materials* (1989) pp. 337-340.

Primary Examiner—Rolf Hille
Assistant Examiner—Steven Loke
Attorney, Agent, or Firm—Morrison & Foerster

[57] ABSTRACT

A semiconductor laser device is disclosed which emits laser light from a facet. The semiconductor laser device comprises a multi-layered structure formed on a semiconductor substrate, the multi-layered structure having an AlGaAs active layer for laser oscillation, and a protective film formed on the facet, wherein a film containing sulfur is provided between the facet and the protective film.

4 Claims, 12 Drawing Sheets (110)-plane (110)-plane

Surface     n-type Semiconductor

Surface     p-type Semiconductor

SEMICONDUCTOR LASER DEVICE WITH A SULFUR-CONTAINING FILM PROVIDED BETWEEN THE FACET AND THE PROTECTIVE FILM

CROSS REFERENCES

This application is a file wrapper continuation of earlier filed U.S. application Ser. No. 07/474,272, filed Feb. 2, 1990, abandoned which application is incorporated herein by reference and to which application we claim priority by reference and to which application we claim priority under 35 USC §120 and is based on Japanese applications 1-26414 filed Feb. 3, 1989; 1-289705 filed Nov. 6, 1989; and 1-341890 filed Dec. 29, 1989, which applications are incorporated herein by reference and to which applications we claim priority under 35 USC §119.

BACKGROUND OF THE INVENTION

1. Field of the Invention

This invention relates to an AlGaAs semiconductor laser device which emits laser light from the facet thereof and it also relates to a method for the production of such a semiconductor laser device.

2. Description of the Prior Art

In recent years, AlGaAs and other types of semiconductor laser devices have widely come into practical use as light sources for optical disc driving units. When semiconductor laser devices are used as the light source for write-once optical disc driving units or rewritable optical disc driving units, they are required to have high reliability at a high output power level of from 40 to 50 mW. When used as the light source for optical pumping of solid-state laser devices such as YAG laser, an output power of 100 mW or more is required.

However, it has been reported that the reliability of the semiconductor laser devices in practical use today which can attain laser oscillation at a relatively high output power level is inversely proportional to the optical output power raised to the fourth power, when the devices of the same construction are compared. In other words, it is extremely difficult to raise the optical output power, while maintaining high reliability.

The principal cause for deterioration of semiconductor laser devices in high output power operation is facet deterioration. This is because heat is generated locally at the laser light emitting facet due to the high light density at this facet. The mechanism of this heat generation will be explained by reference to FIGS. 10a-10b and 11a-11b.

FIGS. 10a and 10b are schematic diagrams showing the energy band structures near the surface originating from the surface state which occur when either the n-type or p-type GaAs (110) surface is slightly oxidized. In the case of either n-type or p-type GaAs, numerous carriers accumulate near the surface to form a so-called "accumulation layer" which is indicated by reference numeral 1 in these figures.

In general, it is well known that the surface state will bend the energy bands near the surface. In addition to the accumulation layer 1 shown in FIGS. 10a and 10b, minority carriers may gather near the surface and majority carriers be distanced from the surface as shown in FIGS. 11a and 11b, resulting in the formation of an inversion layer 2 which is a local inversion of the conductivity type. Whether an accumulation layer 1, or an inversion layer 2 forms, is dependent on the height relationship between the surface state and the Fermi level of the semiconductor. In either case of n-type or p-type GaAs, an accumulation layer will form.

The electrons and positive holes trapped in the surface state $E_s$ are released after a short relaxation time, and this energy is released as heat. Electrons and positive holes are then again trapped in the surface state which has become a vacant state, and the above process is repeated, so that heat continues to be released.

While the above process is being repeated, the heat released from the surface state concentrates at the facets of the semiconductor, and this heat narrows the forbidden band width in the energy bands. Furthermore, the absorption of light increases the minority carriers, and heat generation further increases by way of the surface state. This process raises the temperature of the semiconductor surface, which may reach the melting point of the semiconductor, resulting in facet breakdown.

In the case of GaAs, an accumulation layer forms, while in the case of other materials such as AlGaAs, an inversion layer may form. In the latter case, majority carriers are trapped in the surface state, and facet breakdown occurs by the same process as that by an accumulation layer. In the case of semiconductor laser devices used under a high injection condition, heat generation originating with the surface state becomes a more serious problem.

A structure in which a window area is formed on the facet surface has been proposed as a means of preventing facet deterioration due to heat generation at the facets as described above. This method provides a transparent area with respect to the laser light on the facet surface, whereby light absorption in the facets is eliminated and heat generation caused by light absorption is suppressed. However, the process used to form the window of such a structure is extremely complicated, and the difficulty of forming an optical waveguide in the vicinity of the facets becomes a problem.

The method proposed on pages 263 to 266 in "Extended Abstracts of the 20th Conference on Solid State Devices and Materials, Tokyo (1988)" attempts to improve the surface characteristics in an MIS structure using GaAs. In this method, the oxide film which has been formed on the GaAs surface in air can be removed so as to apply GaS in its place by treating the surface with an aqueous $(NH_4)_2S$ solution. The formation of a GaS film makes it possible to reduce the surface state caused by the oxide film.

However, in the optical devices such as AlGaAs semiconductor laser devices in particular, improvement of the facets by the above-mentioned surface treatment has not yet been attempted. This is because aluminum is an extremely active material and its oxide film is stable, so that the removal of the oxide film is not considered possible.

SUMMARY OF THE INVENTION

The semiconductor laser device of this invention, which overcomes the above-discussed and numerous other disadvantages and deficiencies of the prior art, comprises a multi-layered structure formed on a semiconductor substrate, the multi-layered structure having an AlGaAs active layer for laser oscillation, and a protective film formed on the facet, wherein a film containing sulfur is provided between the facet and the protective film.

In a preferred embodiment, the sulfur-containing film is formed with a sulfur-containing solution selected from the group consisting of undiluted $(NH_4)_2S$ solutions, aqueous $(NH_4)_2S$ solutions, undiluted $(NH_4)_2S_x$ solutions, and aqueous $(NH_4)_2S_x$ solutions.

In a preferred embodiment, the protective film is formed from an oxygen-free material selected from the group consisting of $Si_3N_4$, AlN, C, $MgF_2$, $CaF_2$, NaF, ZnS, and ZnSe.

The method of this invention for the production of a semiconductor laser device as mentioned above, comprises treating the facet with a sulfur-containing solution to form a film containing sulfur on the facet, and forming a protective film on the sulfur-containing film.

In a preferred embodiment, the sulfur-containing solution is selected from the group consisting of undiluted $(NH_4)_2S$ solutions, aqueous $(NH_4)_2S$ solutions, undiluted $(NH_4)_2S_x$ solutions, and aqueous $(NH_4)_2S$ solutions.

In a preferred embodiment, the protective film is formed from an oxygen-free material selected from the group consisting of $Si_3N_4$, AlN, C, $MgF_2$, $CaF_2$, NaF, ZnS, and ZnSe.

In a preferred embodiment, the facet is treated for a time of 1.5/x seconds or more when the sulfur concentration of the solution is x mol/l.

In a preferred embodiment, the protective film is formed by electron beam evaporation at a rate of 10 ÅA/sec or less.

Thus, the invention described herein makes possible the objectives of (1) providing an AlGaAs semiconductor laser device with a construction capable of suppressing the surface state caused by the oxide film on the laser light emitting facet so that facet breakdown does not occur easily even in high output power conditions; (2) providing an AlGaAs semiconductor laser device in which a film containing sulfur is formed on the facets, so that the surface state of the facets can be greatly reduced, and therefore, deterioration due to heat generation in the laser light emitting facet caused by surface recombination can be effectively suppressed, thereby attaining the improved output power with high reliability; (3) providing an AlGaAs semiconductor laser device in which a film composed of materials free from oxygen is formed on the facets as a protective film after surface treatment of the cavity facet surface, so that oxidation by oxygen contained in the protective film cannot occur at the interface between the protective film and the semiconductor crystal, and therefore, a non-radiative recombination center can be suppressed at the facet surface, which, in turn, suppresses facet deterioration, thereby attaining stable laser oscillation at a high output power level for a long period of time; and (4) providing a method for the production of such an AlGaAs semiconductor laser device with excellent characteristics.

BRIEF DESCRIPTION OF THE DRAWINGS

This invention may be better understood and its numerous objects and advantages will become apparent t those skilled in the art by reference to the accompanying drawings as follows.

DESCRIPTION OF THE PREFERRED EMBODIMENTS

The semiconductor laser device of this example has the same structure as that of a conventional semiconductor laser device which emits laser light from the facet thereof, except that a film composed mainly of sulfur is formed on the facets and a protective film is formed on the film composed mainly of sulfur. The following explanation, therefore, covers mainly the formation process for the facets and its structure.

Figure 1:
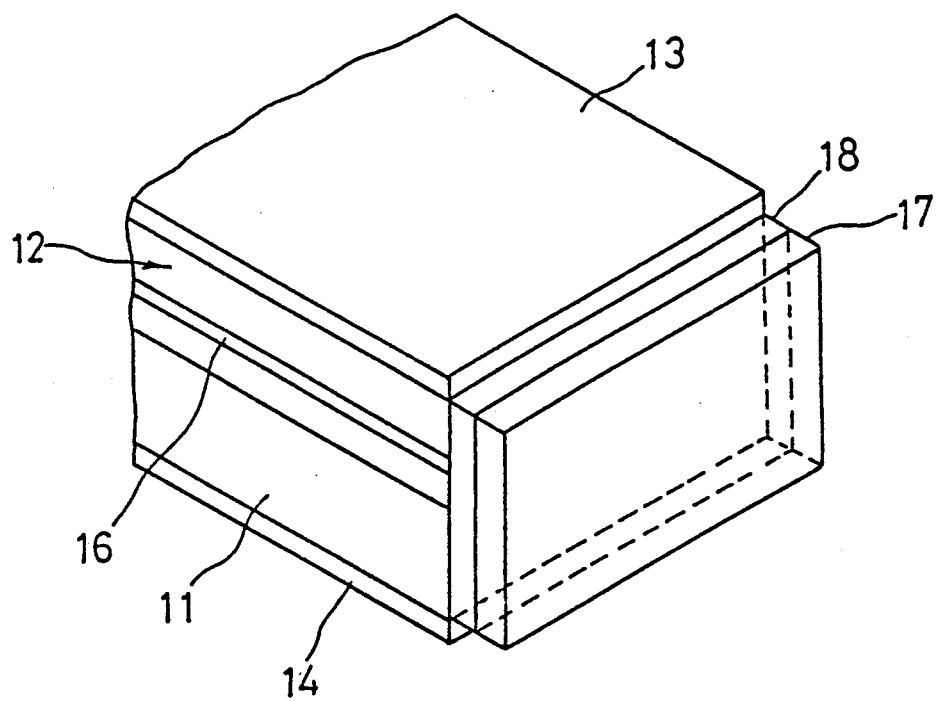
FIG. 1 is a perspective view showing the front facet area of a semiconductor laser device of this invention.

FIG. 1 is a perspective view showing the front facet area of the semiconductor laser device of this example. The production process of this semiconductor laser device is explained below.

Figure 2A:
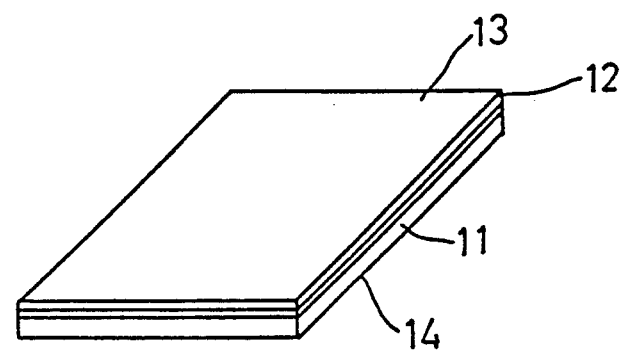
FIGS. 2a-2c are perspective views showing the production of the semiconductor laser device of FIG. 1.

As shown in FIG. 2a, a multi-layered structure 12 including an AlGaAs active layer 16 for laser oscillation was grown on a semiconductor substrate 11, and ohmic electrodes 13 and 14 were formed on the upper face of the multi-layered structure 12 and the back face of the semiconductor substrate 11, respectively.

Figure 2B:
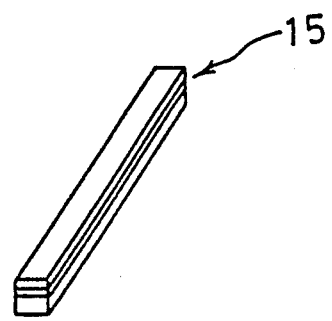
Figure 2C:
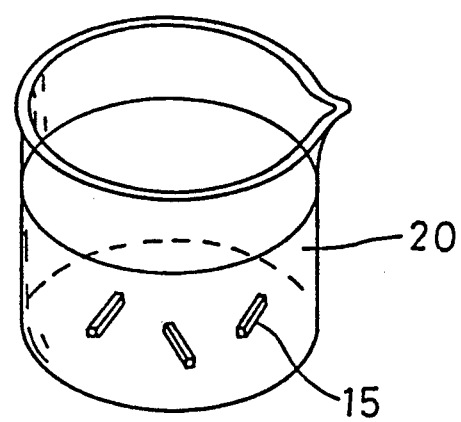

Next, the wafer thus obtained was cleaved by a known cleavage method so as to obtain the prescribed cavity length, resulting in bars 15 as shown in FIG. 2b. Each of the bars 15 has a plurality of cavity units arranged in the direction perpendicular to the cavity direction.

After cleaving, the bars 15 were immediately immersed in a 10% $(NH_4)_2S$ solution 20 and left to stand at room temperature for 3 minutes, so that the cleaved surface of each of the bars 15 was treated to form a film 18 containing sulfur on the facet.

Upon completion of treatment, the bars 15 were washed with water and dried. Then, on the front facet, a reflective film 17 with a 4% reflectance was formed from $Al_2O_3$, and on the rear facet, a reflective film with a 95% reflectance was formed with a multilayered structure comprising $Al_2O_3$ and amorphous silicon. Thereafter, the bars 15 were cleaved again to yield the semiconductor laser devices as shown in FIG. 1.

Figure 3:
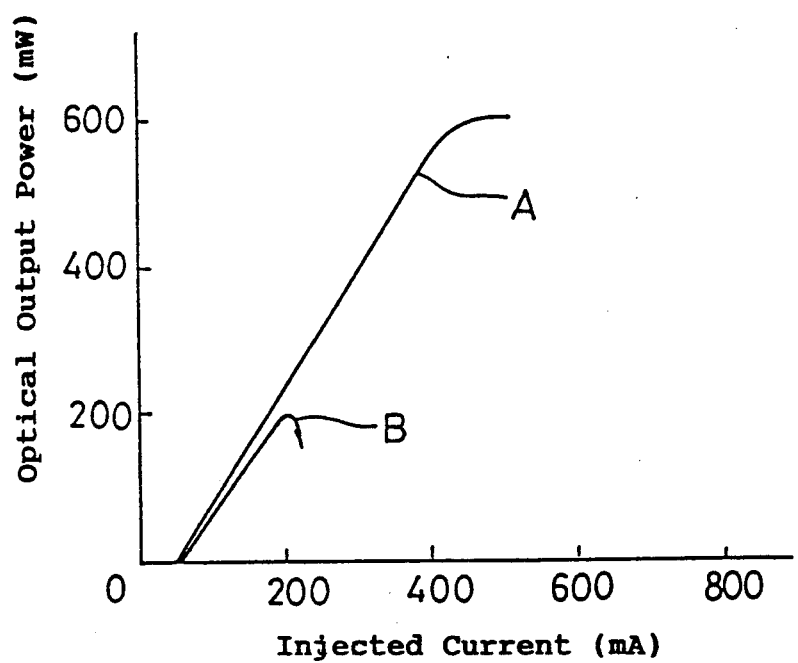
FIG. 3 is a graph showing the injected current-optical output characteristics of the semiconductor laser device of FIG. 1.

FIG. 3 is a graph showing the injected current-optical output characteristics of the semiconductor laser device obtained above (curve A). For comparison, curve B in this figure depicts the injected current-optical output characteristics of a conventional semiconductor laser device in which the reflective film is formed directly on the cleaved surface. In this conventional semiconductor laser device, deterioration of the device characteristics occurs due to breakdown of the facets at an optical output power of approximately 200 mW, whereas in the semiconductor laser device of this example, an optical output power of up to about 600 mW can be obtained, and moreover, facet breakdown does not occur at that point.

In measurements of actual surface state densities made to show that the above findings were due to the lowering of the surface state caused by the oxide film, it was confirmed that the surface state density was approximately $10^8$ to $10^9 cm^{-2}.eV^{-1}$ in the semiconductor laser device of this example. When a GaAs semiconductor laser device was treated in the same way, the smallest value obtained was $10^{11}$ to $10^{12} cm^{-2}.eV^{-1}$, and an effective lowering of the surface state as mentioned above was not seen.

Therefore, in contrast to what was previously thought, the above large lowering effect on the surface state density is assumed to be due to the presence of Al.

In the above examples, after facet treatment, an $Al_2O_3$ film was formed as a protective film on the laser light emitting facet by electron beam evaporation. The following will describe the effect that the rate of formation of a protective film has on the optical output characteristics of semiconductor laser devices.

Figure 12:
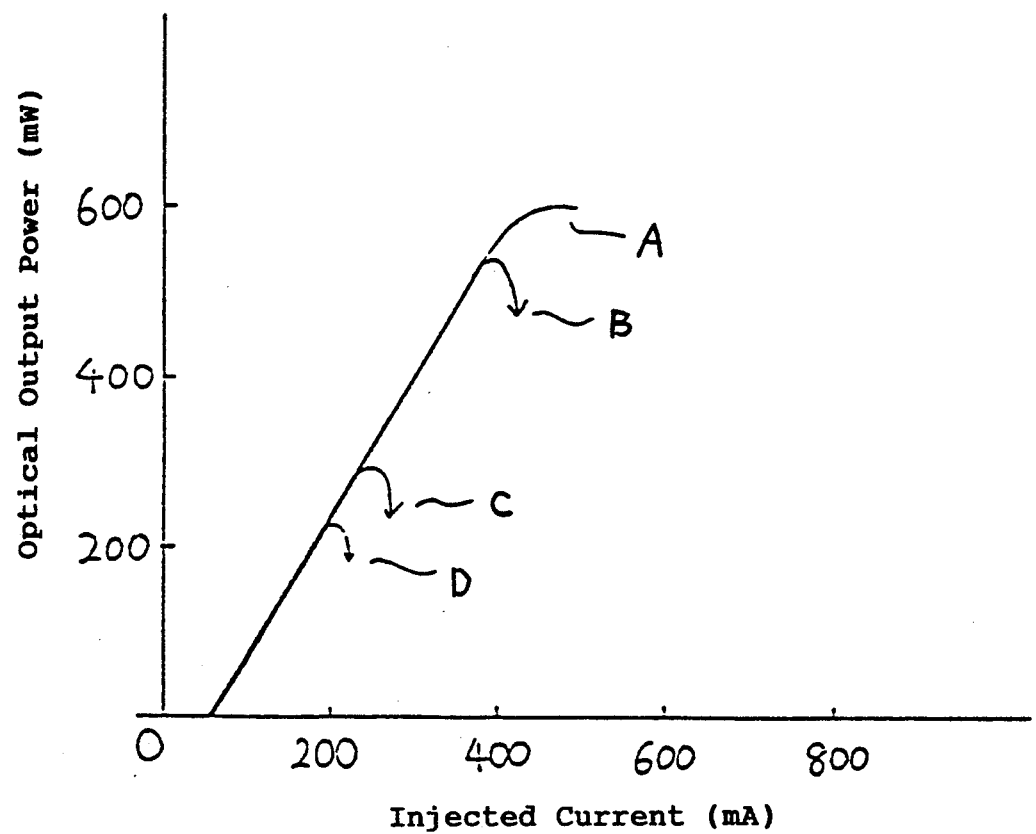
FIG. 12 is a graph showing the relationship between the injected current-optical output characteristics of various semiconductor laser devices in which a protective film was formed on the laser light emitting facet at the prescribed rate.

First, various semiconductor laser devices, in which a protective film was formed on the laser light emitting facet at a rate of 5 Å/sec, 10 Å/sec, 12 Å/sec, and 15 Å/sec, respectively, were produced in the same way as in the above examples. FIG. 12 shows the injected current-optical output characteristics of the semiconductor laser devices thus obtained. In this figure, line A corresponds to the case when the rate of formation of a protective film was 5 Å/sec, line B when it was 10 Å/sec, line C when it was 12 Å/sec, and line D when it was 15 Å/sec.

Figure 13:
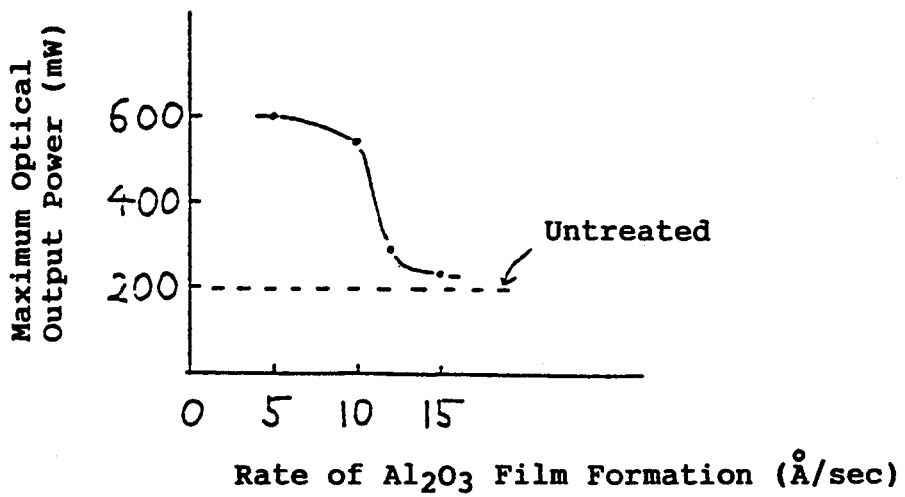
FIG. 13 is a graph showing the relationship between the maximum optical output power and the rate of formation of a protective film in the semiconductor laser devices of FIG. 12.

FIG. 13 is a graph showing the relationship between the maximum optical output power and the rate of formation of a protective film in the semiconductor laser devices mentioned above. For comparison, the maximum optical output power obtained in a conventional facet-untreated semiconductor laser device is shown by a dashed line in this figure.

As can be seen from FIGS. 12 and 13, with an increase in the rate of formation of a protective film, the maximum optical output power decreases and approaches the value of the conventional facet-untreated semiconductor laser device. One possible reason for this is that when the intensity of electron beams emitted is raised to increase the rate of formation of a protective film, a great number of highenergy scattered electrons are generated, and therefore, the film containing sulfur formed on the laser light emitting facet is deteriorated by these scatted electrons.

FIG. 13 indicates that the deterioration of the film containing sulfur will significantly affect the maximum optical output power when the rate of formation of a protective film is more than 10 Å/sec. However, when the rate of formation of a protective film is equal to or less than 10 A/sec, the maximum optical output power of 540 mW or more can be obtained because the film containing sulfur formed on the laser light emitting facet will not be substantially deteriorated.

Moreover, the same experiments as mentioned above were performed with respect to the other facet which was on the opposite side of the semiconductor laser device. From the results obtained, it was found that the optical output characteristics are not substantially dependent on the rate of formation of a protective film to be formed on the other facet from which laser light is not emitted.

Therefore, in order to obtain a greater value of the maximum optical output power, it is preferred that a protective film be formed on the laser light emitting facet at a rate of 10 Å/sec or less.

Although an aqueous $(NH_4)_2S$ solution was used to treat the cleaved surface in the above examples, the surface treatment can also be performed with an undiluted solution instead of the aqueous solution, or with a nonaqueous solution.

Below is an explanation of another example of this invention, in which surface treatment was performed with one of the undiluted and 10% aqueous $(NH_4)_2S$ solutions and the undiluted and 10% aqueous $(NH_4)_2S_x$ solutions. Here, $(NH_4)_2S_x$ denotes a mixture of $(NH_4)_2S$ and $(NH_4)_2S_2$, where the x indicating the composition ratio of sulfur is a real number of from 1 to 2 inclusive.

Figure 4:
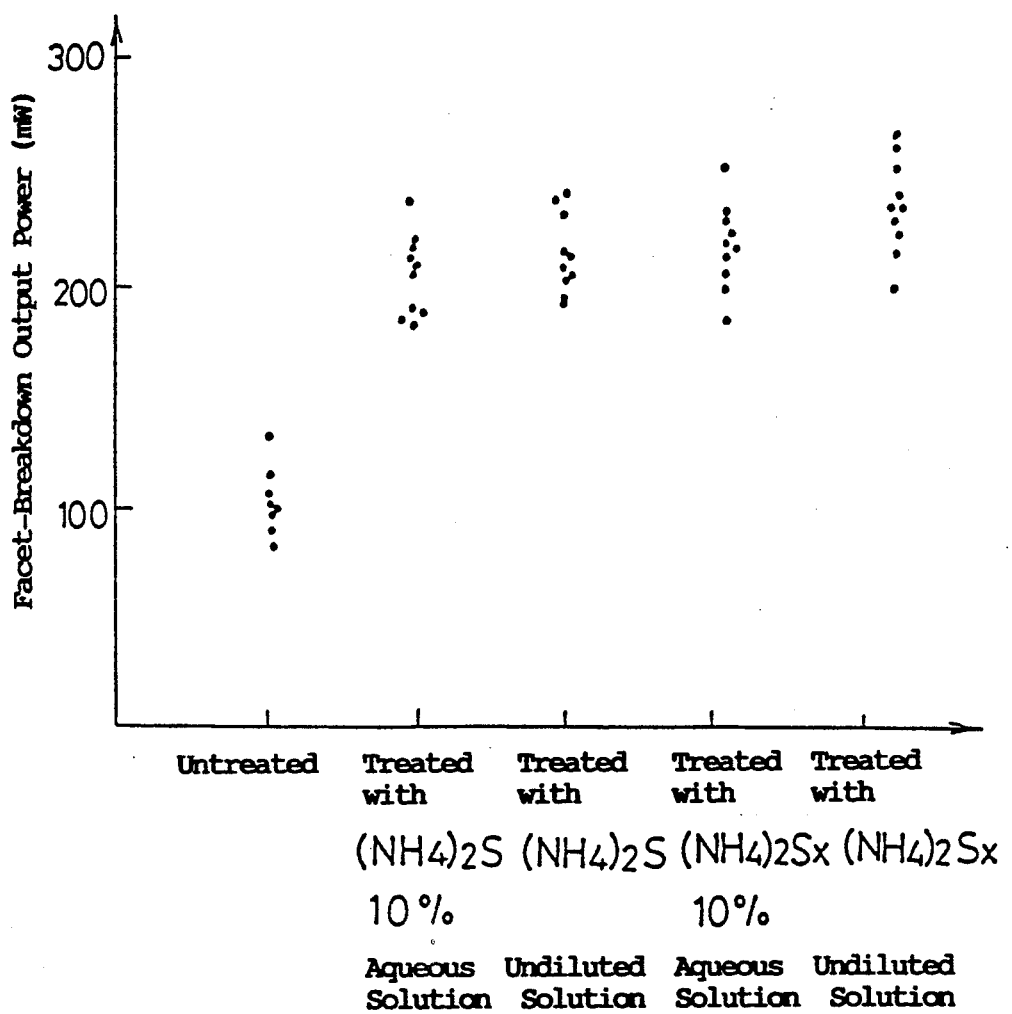
FIG. 4 is a graph showing the facet-breakdown output power of a conventional facet-untreated semiconductor laser device and various facet-treated laser devices of this invention.

FIG. 4 is a graph showing the facet-breakdown output power (mW) of semiconductor laser devices of this example, which were subjected to facet treatment using one of the undiluted and 10% aqueous $(NH_4)_2S$ solutions and the undiluted and 10% aqueous $(NH_4)_2S_x$ solutions, and semiconductor laser devices which were not subjected to facet treatment as a comparative example.

As can be seen from the graph of FIG. 4, the facet-breakdown output powers of the semiconductor laser devices which were subjected to facet treatment using one of the undiluted and 10% aqueous $(NH_4)_2S$ solutions and the undiluted and 10% aqueous $(NH_4)_2S_x$ solutions are significantly higher than those of the semiconductor laser devices of the comparative example.

The thicknesses of the AlGaAs active layers of the semiconductor laser devices of this example and of the semiconductor laser devices of the comparative example were greater than that of the AlGaAs active layer of the semiconductor laser device whose experimental results are shown in FIG. 3. Therefore, the light density is higher and the facet-breakdown output power is lower in the semiconductor laser devices of this example and the comparative example than in the semiconductor laser device whose experimental results are shown in FIG. 3.

In this example, facet treatment of the semiconductor laser device was performed one of the undiluted and 10% aqueous $(NH_4)_2S$ solutions and the undiluted and 10% aqueous $(NH_4)_2S_x$ solutions, but the same effect can be obtained by using a solution of alkali metal compound with sulfur instead of a $(NH_4)_2S$ solution or $(NH_4)_2S_x$ solution. In other words, as long as a film containing sulfur is formed on the facets of the semiconductor laser device, there is no restriction on the material that can be used to treat the cleaved surface.

In order to improve the facet-breakdown output power of a semiconductor laser device in this way, it is important that sulfur be contained in the solution used to treat the facets.

Below is an explanation of the experiment performed to determine the relationship between the sulfur concentration of the solution containing sulfur and the time required to treat the facets with this solution and its results.

The experiment was performed by immersing AlGaAs crystals in $(NH_4)_2S$ solutions with respective sulfur concentrations of 0.015 mol/liter, 0.15 mol/liter, and 0.5 mol/liter, and then evaluating the AlGaAs crystal surface by Auger electron spectroscopy. The temperature of the solutions during immersion was about room temperature.

Figure 5:
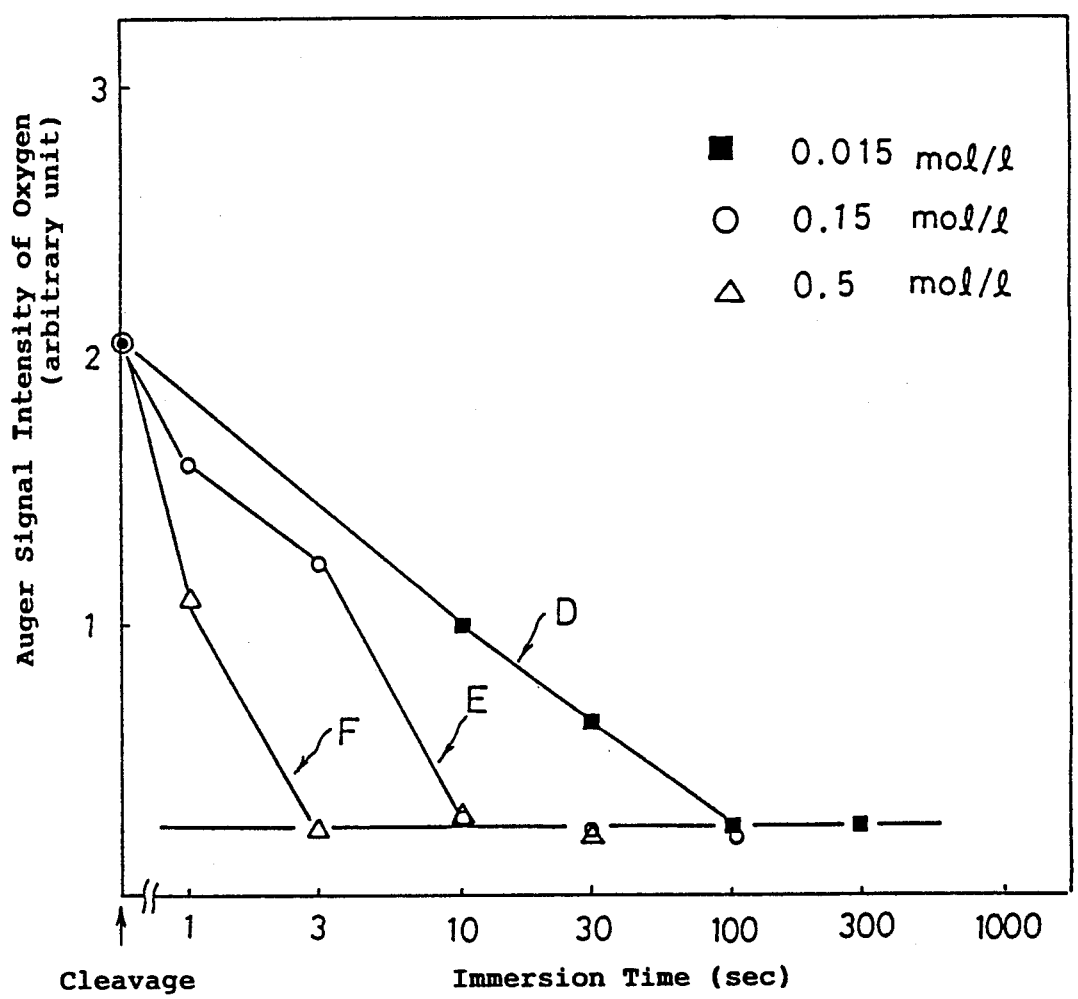
FIG. 5 is a graph showing the relationship between the Auger signal intensity of oxygen and the immersion time.

FIG. 5 is a graph showing the relationship between the Auger signal intensity of the oxygen present in the AlGaAs crystal surface as determined by Auger electron spectroscopy and the immersion time. In the graph, line D depicts the relationship when the sulfur concentration in the solution used was 0.015 mol/liter, line E when it was 0.15 mol/liter, and line F when it was 0.5 mol/liter.

As indicated by the graph, no matter what concentration was used, the Auger signal intensity of oxygen became lower and neared the background signal intensity with longer immersion times.

Figure 6:
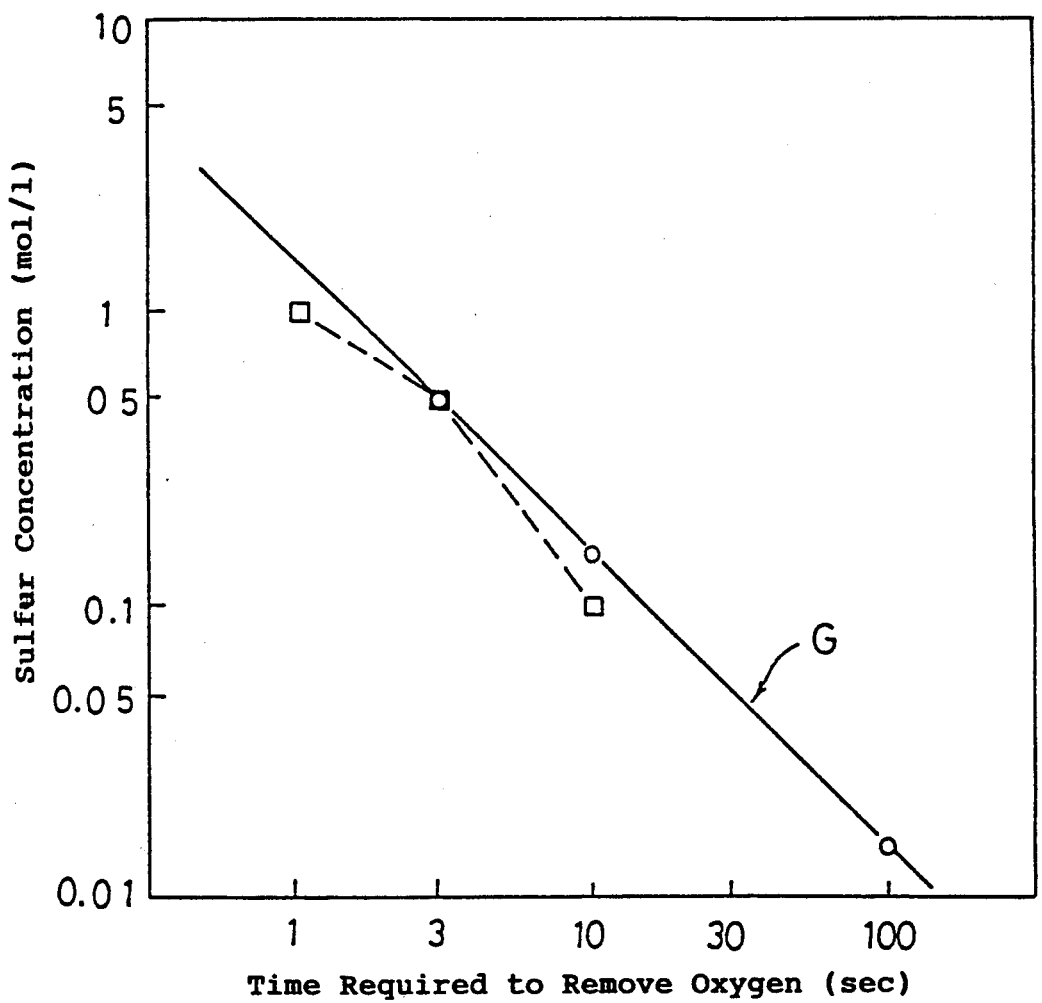
FIG. 6 is a graph showing the relationship between the immersion time until the Auger signal intensity of oxygen reaches the background level and the sulfur concentration of the solution.

FIG. 6 is a dual logarithmic graph showing the relationship (line G) between the immersion time until the Auger signal intensity of oxygen reached the background level as determined by the above experiment (time required to remove oxygen) and the sulfur concentration of the solution. The graph also shows the relationship (dashed line) between the immersion time until the Auger signal intensity of oxygen reached the background level and the sulfur concentration of the solution, when an aqueous $Na_2S$ solution, which is a solution of alkali metal compound with sulfur, was used as the treatment solution.

As can be seen in FIG. 6, the immersion time until the Auger signal intensity of oxygen reached the background level and the sulfur concentration of the solution were nearly inversely proportional. This indicates that oxygen present as a component of the oxide film or the like on the AlGaAs crystal surface is removed from the AlGaAs crystal surface by reaction with sulfur in the solution as indicated in the following reaction equation I:

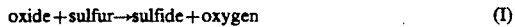

$$\text{oxide} + \text{sulfur} \rightarrow \text{sulfide} + \text{oxygen} \quad (I)$$

The rate of reaction to the right of the above reaction is given by the following equation II:

$$-d[oxide]/dt = K \cdot [oxide] \cdot [S] \quad (II)$$

where [oxide] is the concentration of oxide on the AlGaAs crystal surface, [S] is the sulfur concentration of the solution, K is the rate constant, and t is the elapsed time from the start of immersion. The left side of equation II is the time differential of [oxide] and indicates the rate at a certain time at which the oxide on the AlGaAs crystal surface is removed from this surface.

By solving the above differential equation II, [oxide] can be expressed as a function of time t as shown in the following equation III:

$$[oxide] = [oxide]_0 \cdot exp(-K[s]t) \quad (III)$$

where $[oxide]_0$ is the value of [oxide] at the start of immersion (i.e., t=0). Since the total amount of sulfur in the solution is much greater than the total amount of oxide on the AlGaAs crystal surface, we handled [S] as a constant independent of time when solving the above differential equation II.

From equation III, the time $t_c$ required for [oxide] to decrease to an 1% level of $[oxide]_0$ is given by the following equation IV.

$$t_c = (ln100)/K \cdot [S]) \quad (IV)$$

Equation IV indicates time required to remove 99% of the oxygen present as a component of the oxide film or the like on the AlGaAs crystal surface, from this surface by reaction with the sulfur in the solution is inversely proportional to the sulfur concentration in the solution. This agrees with the experimental results shown in the graph of FIG. 6.

By fitting the above equation IV to the relationship (line G) shown in the graph of FIG. 6, the following equation V is obtained:

$$t_c = 1.5/[S] \quad (V)$$

where the unit for $t_c$ is seconds, the unit for [S] is mol/liter, and the unit for 1.5 is sec mol/liter.

When a solution with a sulfur concentration of 0.015 mol/liter is used, the above equation V yields $t_c = 100$ sec. Therefore, when a solution with a sulfur concentration of 0.015 mol/liter is used, the oxide film on the AlGaAs crystal surface of the facets cannot be completely removed if the facets are treated for less than 100 seconds. That is, in order to remove almost all of the oxide film on the AlGaAs crystal surface, the facets must be treated for a period of time equal to or longer than the time $t_c$ indicated by the above equation V.

Using the above experimental results and observations in this way, we determined the immersion time required to remove almost all of the oxide film on the AlGaAs crystal surface.

Based on these results, by treating the facets for an appropriate period of time depending on the sulfur concentration of the solution used, insufficient removal of the oxide film on the facets due to insufficient treatment time and wasted time due to treatment of the facets for an unnecessarily long time could be avoided.

As indicated by the graph of FIG. 6, using $Na_2S$ as the facet treatment solution removed the oxide film on the AlGaAs crystal surface like when a $(NH_4)_2S$ solution was used. However, semiconductor laser devices which had been subjected to facet treatment using a $(NH_4)_2S$ solution or $(NH_4)_2S_x$ solution exhibited excellent reliability as compared with semiconductor laser devices which had been subjected to facet treatment using a $Na_2S$ solution. Of the solutions containing sulfur, $(NH_4)_2S$ solutions and $(NH_4)_2S_x$ solutions are superior facet treatment solutions from the standpoint of reliability of the semiconductor laser device.

In the facets of a semiconductor laser device which was produced by forming an $Al_2O_3$ film on the facets as a protective film after the surface of the facets is treated with a solution containing sulfur, oxygen contained in the protective film will oxidize the crystal surface of the semiconductor while the semiconductor laser device is used for a long period of time, and this prevents the semiconductor laser device from performing stable laser oscillation for a long period of time at high output power. An example that solves this problem is explained below.

Figure 7:
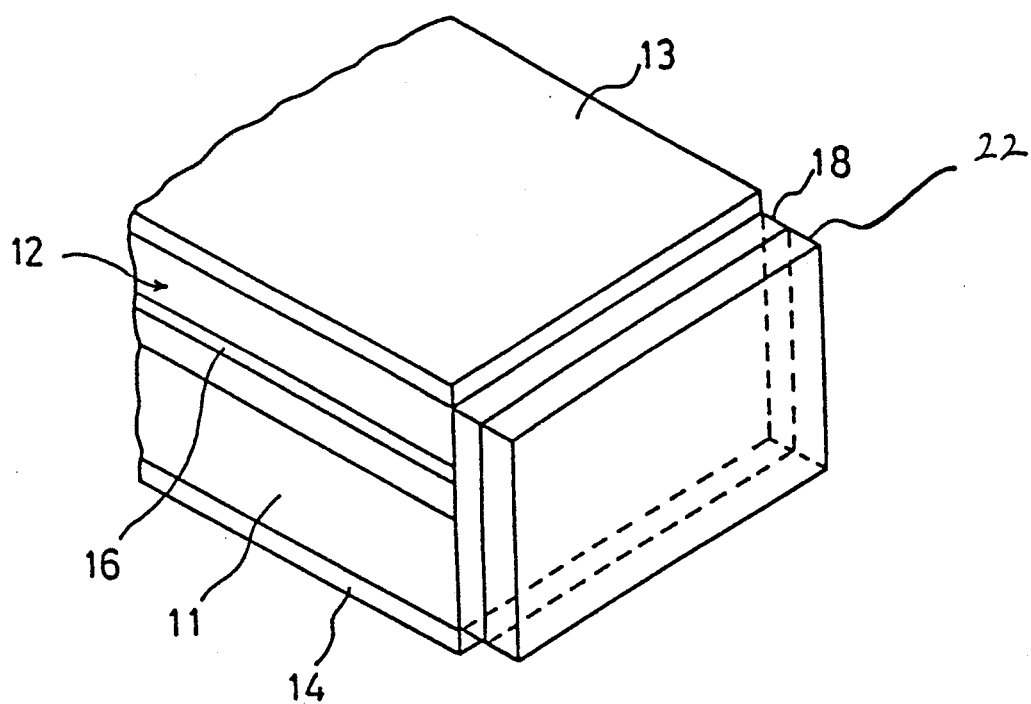
FIG. 7 is a perspective view showing still another semiconductor laser device of this invention.

FIG. 7 is a perspective view showing the front facet of the semiconductor laser device of this example In the semiconductor laser device of this figure, a multi-layered structure 12 including an AlGaAs active layer 16 is formed on a semiconductor substrate 11, and ohmic electrodes 13 and 14 are provided on the upper face of the multi-layered structure 12 and the back face of the semiconductor substrate 11, respectively. The facets are covered with a protective film 22 composed of a material free from oxygen. Between the semiconductor crystal and the protective film 22, there is formed a thin film 18 containing sulfur with a thickness of only several molecules.

The following is an explanation of the method used to produce the semiconductor laser device shown in FIG. 7.

After first forming a multi-layered structure 12 composed of an AlGaAs active layer 16 and other semiconductor layers on the semiconductor substrate 11, ohmic electrodes 13 and 14 were formed on the upper face of the multi-layered structure 12 and the back face of the semiconductor substrate 11, respectively.

Next, the wafer thus obtained was cleaved to form bars in which a plurality of cavity units Of the prescribed cavity length were arranged in a direction perpendicular to the cavity direction.

The bars were then immersed in a 10% $(NH_4)_2S$ aqueous solution to treat the surface of the cavity facets. The temperature of the aqueous solution at this time was about room temperature. After surface treatment, the bars were washed in purified water and then dried. This surface treatment removed the oxide film that had been formed on the facet surface. At this time, a thin film containing sulfur was formed on the facet surface from which the oxide film was removed. This film prevents direct contact between the semiconductor crystal surface and air, etc., and thereby prevents the formation of a natural oxide film on the facets.

Thereafter, a protective film 22 composed of $Si_3N_4$ and free from oxygen was formed on the laser light emitting side of the cavity facets using a plasma CVD method. The thickness of the protective film 22 was set to $\lambda/(4n)$ Å, where $\lambda$ is the oscillation wavelength in Å of the laser light and n is the refractive index of the protective film 22. The reflectance of the laser light emitting facet formed in this manner was 5%. Using a plasma CVD method, a multilayer film composed of an $Al_2O_3$ film and a silicon film was formed on the other facet of the cavity. The reflectance of this facet was 95%. The semiconductor laser devices were then produced by the usual process.

The following will describe the results of an experiment comparing a semiconductor laser device of this example with a semiconductor laser device as a comparative example in which the facet surface was treated with a $(NH_4)_2S$ aqueous solution and then an $Al_2O_3$ protective film was formed on the facet.

First, a comparison of both semiconductor laser devices was performed with respect to optical output power and facet deterioration. The results showed that facet breakdown occurred in the semiconductor laser device of the comparative example when operating at optical output power of 200 mW. In the semiconductor laser device of this example, however, facet breakdown did not occur when operating even at optical light output power of 400 mW and stable laser oscillation continued. The same result was obtained when the experiment was performed after the semiconductor laser device of this example was left to stand for a long period of time.

As explained above, in the semiconductor laser device of this example, the facets were covered with a film containing sulfur, and a protective film composed of a material free from oxygen was formed over this film. Therefore, there was no oxidation at the interface between the semiconductor crystal of the semiconductor laser device and the protective film due to oxygen contained in the protective film, whereby the increase in a non-radiative recombination center was suppressed and, in turn, deterioration of the facets was suppressed. For this reason, the semiconductor laser device of this example can attain stable laser oscillation at high output power for a long period of time.

Figure 8:
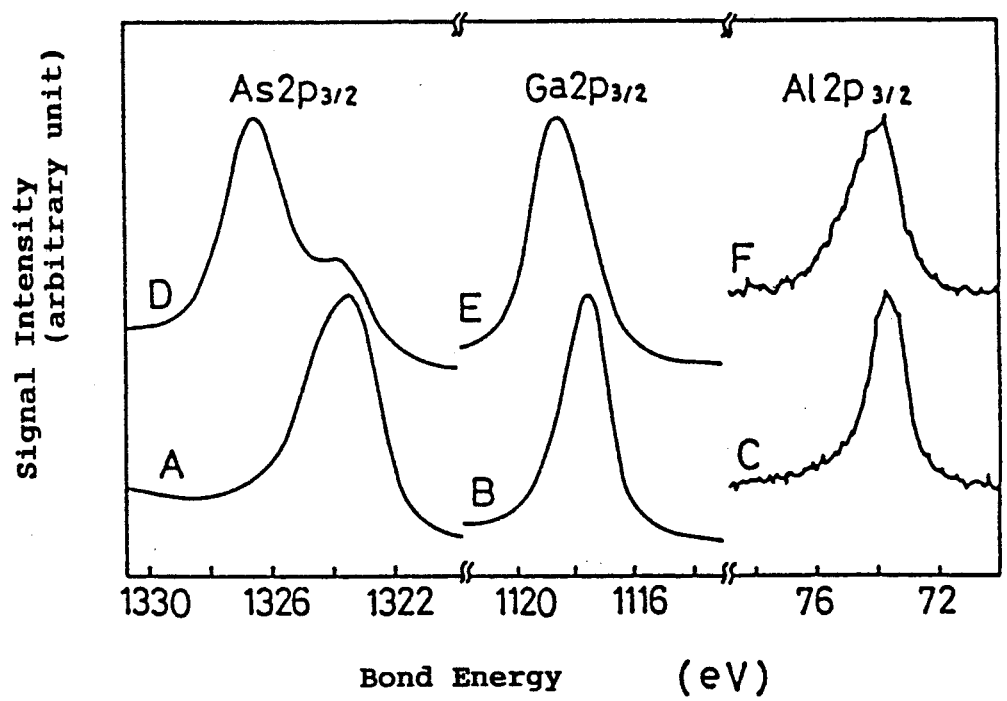
FIG. 8 is a graph showing the relationship between the signal intensity and the bond energy of particular elements in the interface between the protective film and the semiconductor crystal of the semiconductor laser devices of FIG. 7 and of a comparative example.

Next, after letting the semiconductor laser devices of this example and the comparative example stand in air for six months, they were placed in a high vacuum chamber, the protective film was removed by argon ion spattering and the condition of the chemical bond at the interface between the semiconductor crystal and the protective film was analyzed by photoelectron spectroscopy. FIG. 8 shows the relationship between the signal intensity obtained in these results (arbitrary unit) and the bond energy (in eV). In FIG. 8, the signals A, B, and C were obtained from the $^2P_{3/2}$ level for As, Ga, and Al, respectively, in the interface of the semiconductor laser device of this example. The signals D, E, and F were obtained from the $^2P_{3/2}$ levels for As, Ga, and Al, respectively, in the interface of the semiconductor laser device of the comparative example. The signals A, B, and C in FIG. 8 do not show a shift in bond energy due to bonding with oxygen. The signals D, E, and F, however, are shifted along the x-axis due to bonding with oxygen. From this, it can be seen that oxidation has occurred in the interface between the semiconductor crystal and the protective film in the semiconductor laser device of the comparative example. It indicates that in the semiconductor laser device of the comparative example, some of the oxygen contained in the protective film reached the interface between the protective film and the semiconductor crystal, where it bonded with constituent atoms at the surface of the semiconductor crystal. In the semiconductor laser device of this example, however, the protective film does not contain oxygen, so that this kind of oxidation did not occur at the interface between the protective film and the semiconductor crystal.

In this example, a film free from oxygen was formed as a protective film only on the laser light emitting facet, but the same film can also be formed on the other facet.

Next is an explanation of another method for the production of the semiconductor laser device of FIG. 7.

Figure 9A:
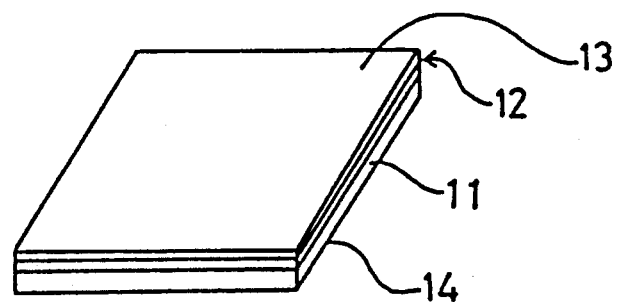
FIGS. 9a-9c are perspective views showing another method for the production of the semiconductor laser device of FIG. 7.

First, a multi-layered structure 12 composed of an AlGaAs active layer and other semiconductor layers was formed on the semiconductor substrate 11 by the usual method, and then ohmic electrodes 13 and 14 were formed on the upper face of the multi-layered structure 12 and the back face of the semiconductor substrate 11, respectively, as shown in FIG. 9a.

Figure 9B:
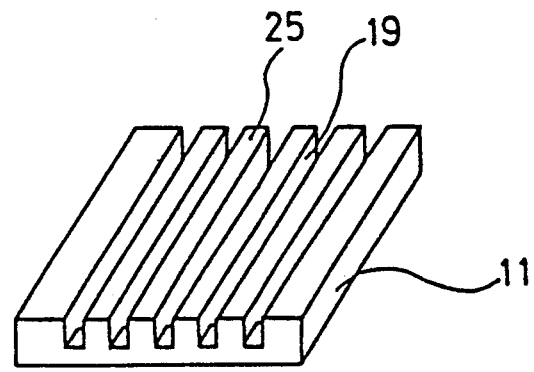

Then, specified parts of the semiconductor substrate 11 were etched by reactive ion beam etching using chlorine gas to form mirror planes 19, whereby sections 25, each of which comprised a plurality of cavity units of the prescribed cavity length in a direction perpendicular to the cavity direction, were formed on the substrate 11 as shown in FIG. 9b.

Figure 9C:
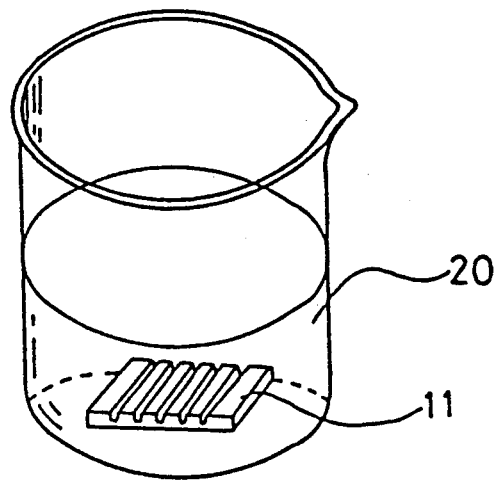
Figure 10A:
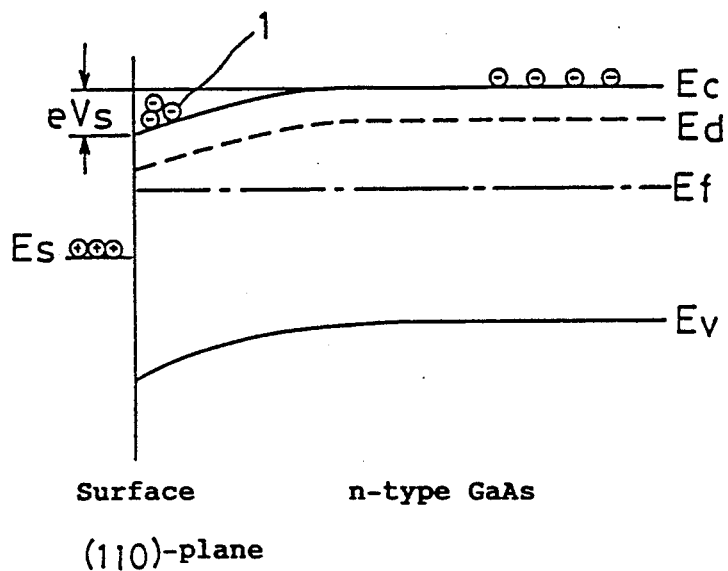
FIGS. 10a and 10b are schematic energy band diagrams showing the formation of a carrier accumulation layer in the surface area of n-type and p-type GaAs, respectively.
Figure 10B:
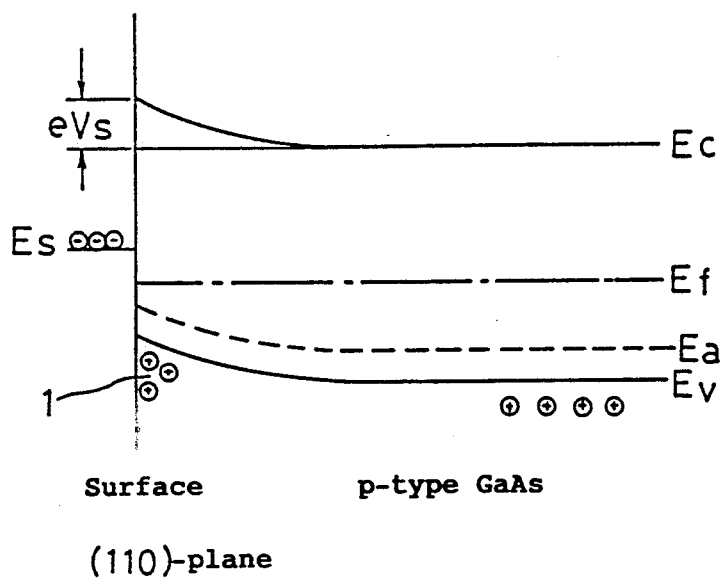
Figure 11A:
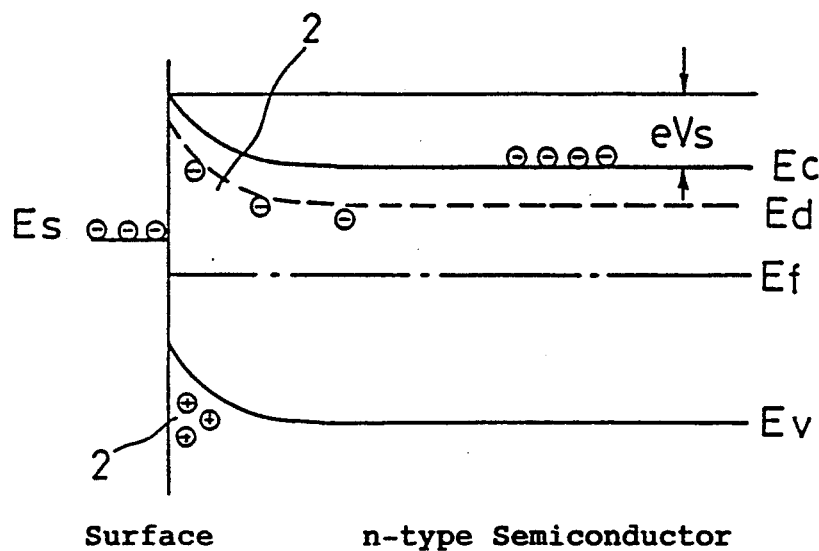
FIGS. 11a and 11b are schematic energy band diagrams showing the formation of an inversion layer in the surface area of n-type and p-type semiconductors, respectively.
Figure 11B:
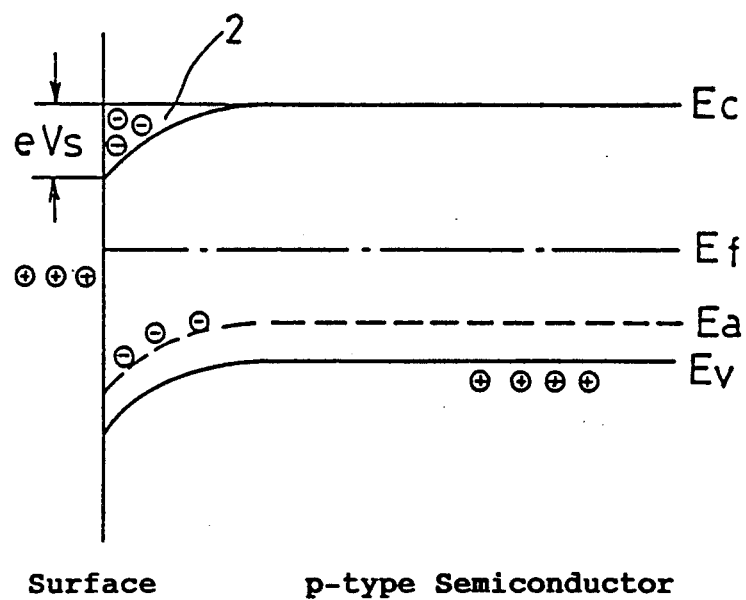

The wafer thus obtained was then immersed in an aqueous $(NH_4)_2S$ solution 20 to treat the surfaces of the cavity facets as shown in FIG. 9c. The temperature of the aqueous $(NH_4)_2S$ solution 20 at this time was about room temperature and the immersion time was 3 minutes. Upon completion of the surface treatment, the wafer was washed in pure water and then dried.

Thereafter, a protective film 22 composed of $Si_3N_4$ was formed on both facets of the cavity by a plasma CVD method (see FIG. 7). The thickness of the protective film 22 was set to $\lambda/(2n)$ Å, where $\lambda$ was the oscillation wavelength Å of the laser light and n was the refractive index of the protective film 22. As a result, the reflectance of both cavity facets was 32%. The semiconductor laser devices were then produced by the usual process.

The semiconductor laser devices in which the facets were formed by etching in this manner yielded the same results as the previous example.

In the above examples, an $Si_3N_4$ film was used as the film free from oxygen, but films made from other materials such as AlN, C, $MgF_2$, $CaF_2$, NaF, ZnS, or ZnSe can also be used. Multilayer films in which films made from these materials are laminated can also be used. Moreover, in the above examples, a plasma CVD method was used as the method for forming the protective film free from oxygen, but other film forming methods such as electron beam evaporation and spattering can also be used.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device which emits laser light from a facet, comprising a multi-layered structure including a pair of electrodes and formed on a semiconductor substrate, said multi-layered structure having an AlGaAs active layer for laser oscillation, and a protective film formed on said facet of said multi-layered structure, the device wherein a film containing sulfur is provided between the facet and the protective film so as to be formed directly on said facet; and wherein said sulfur-containing film consists essentially of chemical elements selected from the group consisting of gallium, aluminum, arsenic, nitrogen, hydrogen, and sodium, in addition to a sulfide of AlGaAs.

2. A semiconductor laser device according to claim 1, wherein said protective film is formed from an oxygen-free material selected from the group consisting of $Si_3N_4$, AlN, C, $MgF_2$, $CaF_2$, NaF, ZnS, and ZnSe.

3. A semiconductor laser device, comprising:
   an AlGaAs active layer for laser oscillation which layer includes a facet which emits laser light;
   a sulfur containing film on the facet formed so as to remove 99% or more of the oxygen present on the facet; and
   a protective film covering the sulfur containing film.

4. The semiconductor laser device of claim 3, wherein the protective layer is comprised of a material selected from the group consisting of $Si_3N_4$, AlN, C, $MgF_2$, $CaF_2$, NaF, ZnS and ZnSe.

* * * * *